United States Patent [19]
Pierrat

[11] Patent Number: 5,718,829
[45] Date of Patent: Feb. 17, 1998

[54] PHASE SHIFT STRUCTURE AND METHOD OF FABRICATION

[75] Inventor: Christophe Pierrat, Boise, Id.

[73] Assignee: Micron Technology, Inc., Boise, Id.

[21] Appl. No.: 522,850

[22] Filed: Sep. 1, 1995

[51] Int. Cl.$^6$ .................. G03F 9/00; B44C 1/22
[52] U.S. Cl. .................. 216/12; 216/24; 430/5
[58] Field of Search ............ 216/24, 12; 430/5

[56] References Cited

U.S. PATENT DOCUMENTS

| | | | |
|---|---|---|---|
| 5,045,417 | 9/1991 | Okamoto | 430/5 |
| 5,281,500 | 1/1994 | Cathey et al. | 430/5 |
| 5,288,568 | 2/1994 | Cathey, Jr. | 430/5 |
| 5,338,626 | 8/1994 | Garofalo et al. | 430/5 |
| 5,495,959 | 3/1996 | Rolfson | 216/12 |
| 5,536,604 | 7/1996 | Ito | 430/5 |
| 5,582,939 | 12/1996 | Pierrat | 430/5 |

OTHER PUBLICATIONS

Pierrat et al., "Phase Shifting Mask Topography Effects on Lithographic Image Quality," SPIE vol. 1927, pp. 28–41, 1993.

Phase–Shifting Mask Topography Effects on Lithographic Image Quality, Christophe Pierrat et al., SPIE vol. 1927, Optical/Laser Micro–lithography, 1993.

Improving Resolution in Photolithography with a Phase–Shifting Mask, Marc D. Levenson et al., IEEE Transactions on Electron Devices, vol. Ed 29, No. 12, Dec., 1982, pp. 1828–1836.

Phase–Shifting and Other Challenges in Optical Mask Technology, B. J. Lin, IBM General Technology Division, Hopewell Junction, NY, Sep., 1990.

Primary Examiner—R. Bruce Breneman
Assistant Examiner—Michael E. Adjodha
Attorney, Agent, or Firm—Stephen A. Gratton

[57] ABSTRACT

A phase shift structure and a method for forming the phase shift structure are provided. The phase shift structure includes: a transparent substrate; a phase shifter etched into the substrate; and a pair of opaque members formed on the substrate on either side of the phase shifter. The phase shift structure is adapted to print an isolated linear feature such as an isolated line for a semiconductor integrated circuit. During a lithographic process using the phase shift structure, the inside edges of the opaque members do not print due to the effect of the phase shifter. The longitudinal edges of the printed feature correspond to the outside edges of the opaque members. The width of the phase shifter can be adjusted to minimize light leakage in the interior of the printed feature.

40 Claims, 5 Drawing Sheets

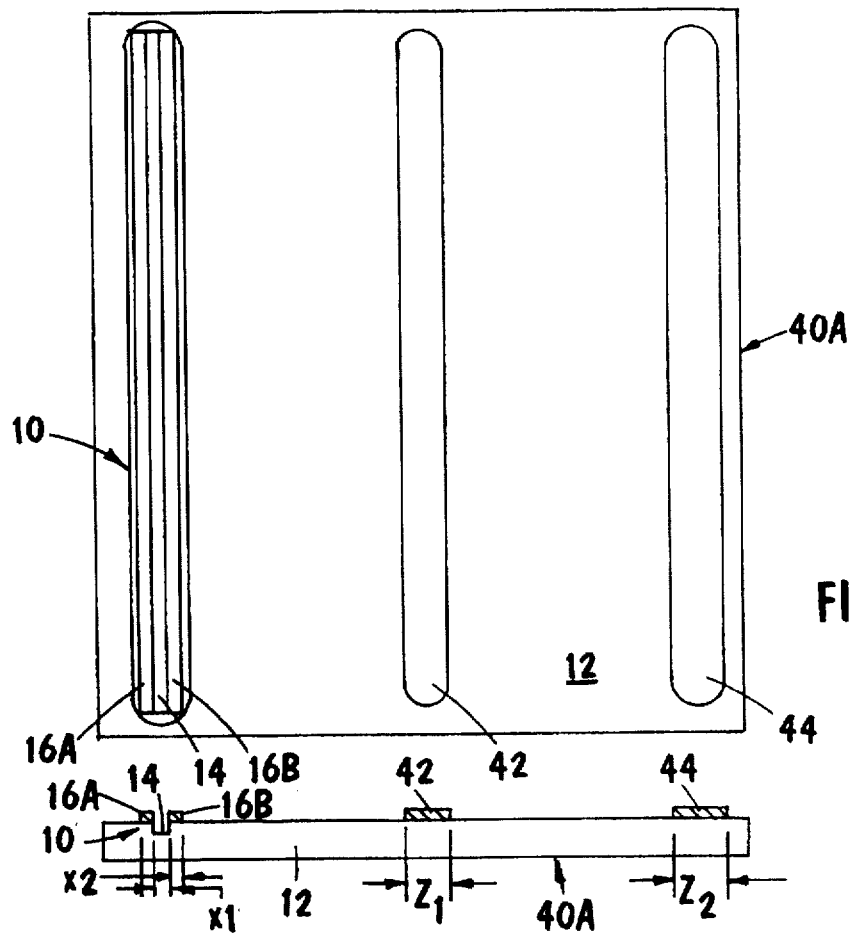
FIGURE 5A
FIGURE 5B
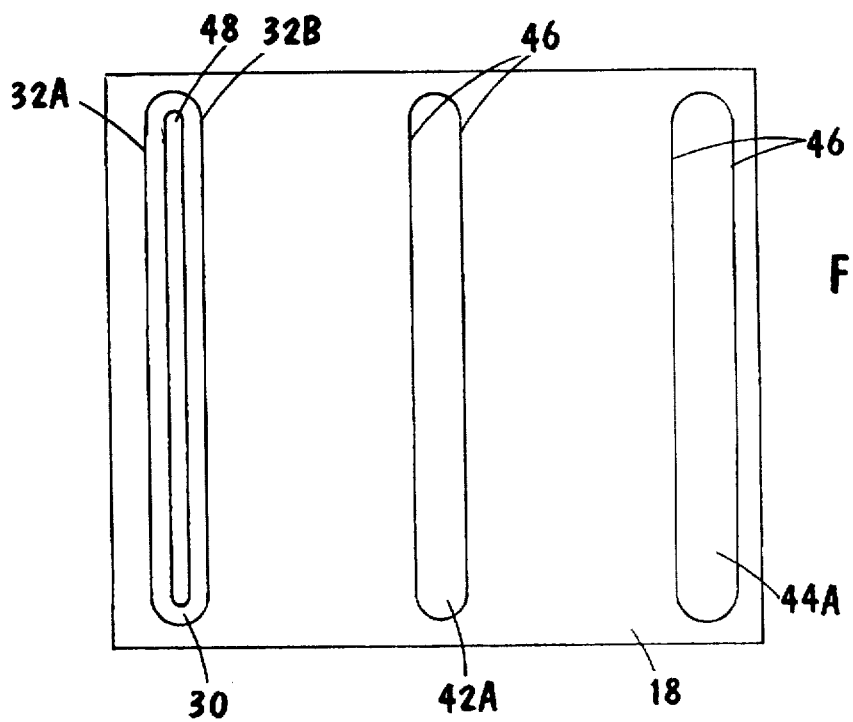
FIGURE 5C

PHASE SHIFT STRUCTURE AND METHOD OF FABRICATION

This invention was made with Government support under Contract No. MDA972-92-C-0054 awarded by Advanced Research Proj ARPA). The Government has certain rights in this invention.

FIELD OF THE INVENTION

This invention relates generally to phase shift lithography for semiconductor manufacture. More particularly, this invention relates to a phase shift structure for forming isolated features and to a method for fabricating phase shift reticles containing such a structure.

BACKGROUND OF THE INVENTION

In lithography, an exposure energy, such as ultraviolet light, is passed through a reticle (or mask) and onto a target such as a silicon wafer. The reticle contains opaque and transparent regions formed in a predetermined pattern. The exposure energy exposes the reticle pattern on a layer of resist formed on the target. The resist is then developed for removing either the exposed portions of resist for a positive resist or the unexposed portions of resist for a negative resist. This forms a resist mask. The resist mask can then be used in subsequent fabrication processes. In semiconductor manufacture such a resist mask can be used in deposition, etching, or ion implantation processes, to form integrated circuits having very small features.

One technique used in lithography is known as phase shift lithography. With phase shift lithography, the interference between light waves is used to overcome diffraction and improve the resolution and depth of the images projected onto the target. In phase shift lithography, the phase of the exposure light is controlled such that adjacent bright areas are formed at the target which are 180° ($\pi$) out of phase with one another. Dark regions are thus produced between the bright areas by destructive interference. This technique improves total resolution at the target and allows resolutions as fine as 0.10 µm to occur.

There are several different types of phase shift structures. These types include: alternating aperture phase shift structures, subresolution phase shift structures and rim phase shift structures. In general, these phase shift structures are constructed on reticles (or masks) having three distinct layers of material. An opaque layer is patterned to form light blocking areas that allow none of the exposure light to pass through. A transparent layer, typically the substrate, is patterned with light transmissive areas which allow close to 100% of the exposure light to pass through. A phase shift layer is patterned with phase shift areas which allow close to 100% of the exposure light to pass through but phase shifted by 180° ($\pi$). The transmissive and phase shifting areas are situated such that exposure light diffracted through each area is canceled out in a darkened area therebetween. This creates the pattern of dark and bright areas which can be used to clearly delineate features. These features are typically defined by the opaque layer (i.e., opaque features) or by openings in the opaque layer (i.e., clear features).

For semiconductor manufacture alternating aperture phase shift reticles are widely used. Alternating aperture phase shift reticles are employed where there are a number of pairs of closely packed opaque features. However, in situations where a feature is too far away from an adjacent feature to provide phase shifting, subresolution phase shift structures are employed. This technique is widely used for isolated features such as contact holes and line openings. Subresolution phase shift structures typically include assist-slots or outrigger structures on the sides of a feature. These structures are below the resolution limit of the lithographic system and therefore do not print on the target. One shortcoming of subresolution phase shift structures is that they require a relatively large amount of real estate on the reticle.

Rim phase shifting reticles include phase shift structures that are formed at the rim of features defined by opaque areas of the reticle. One problem with rim phase shifter structures is that they are difficult to manufacture. In the case of rim phase shift structures, multiple lithographic steps must be used to uncover the opaque layer so that it can be etched away in the area of the rim phase shifter. This step is difficult as the resist used in the lithographic step covers not only the opaque layer but also trenches etched into the substrate.

Another type of phase shift reticle is known as a chromeless reticle. A chromeless reticle does not include solid opaque areas, or openings in an opaque area, to convey a pattern. Rather, in a chromeless reticle, phase shifters can be formed of a transparent substrate having an increased thickness relative to light transmission areas of the substrate. With a chromeless reticle, the pattern is carried by the edge of the phase shifters which prints a narrow dark line, or null, on the target. One problem with a chromeless reticle is that the printed features can be adversely affected by areas of light leakage across the phase shifter edge. In other words light can leak into the middle of the printed feature so that the it does not print as a continuous line.

The present invention is directed to a phase shift structure that overcomes some of the above problems. Accordingly it is an object of the present invention to provide an improved phase shift structure for printing isolated opaque features such as opaque lines and to a method for forming reticles having such a phase shift structure.

It is another object of the present invention to provide an improved phase shift structure that can be used to print isolated features and which can be incorporated on a reticle having an alternating aperture phase shift pattern.

It is a further object of the present invention to provide an improved phase shift structure which requires less space on a reticle than assist-slot and outrigger types of phase shift structures and which produces a minimum of light leakage.

It is yet another object of the present invention to provide an improved phase shift reticle that is simple to construct and which can be used in volume semiconductor manufacture.

Other objects, advantages and capabilities of the present invention will become more apparent as the description proceeds.

SUMMARY OF THE INVENTION

In accordance with the present invention, an improved phase shift structure and a method for forming a reticle containing the phase shift structure are provided. The phase shift structure, simply stated, includes: a transparent substrate; a phase shifter etched into the substrate; and a pair of opaque members formed on the substrate on either side of the phase shifter. The etched depth of the phase shifter is controlled such that exposure light passing through the phase shifter is phase shifted 180° with respect to exposure light passing through unetched portions of the substrate. In addition, the width of the phase shifter is controlled such that the phase shifter does not print on the wafer.

In use in a lithographic process, this phase shift structure prints a thin linear feature having longitudinal edges which correspond to the outer edges of the opaque members. The longitudinal edges of the printed feature are sharply formed due to phase canceling of diffracted light by the phase shifter in the interior of the printed feature. In addition, the interior of the printed feature is formed with almost no light intensity due to phase canceling by the phase shifter. Such a phase shift structure can be used to form an isolated feature and can be incorporated on a reticle containing an alternating aperture phase shift pattern.

A method for forming a phase shift reticle incorporating the phase shift structure includes the steps of: forming a transparent substrate; forming an opaque layer on the substrate; patterning the opaque layer to form spaced opaque members; etching the substrate to form a phase shifter between the opaque members with a width of the phase shifter selected to minimize light leakage in an interior of the feature.

BRIEF DESCRIPTION OF THE DRAWINGS

FIG. 5A is a plan view of a phase shift reticle including a phase shift structure constructed in accordance with the invention;

FIG. 5B is a schematic cross sectional view of the phase shift reticle shown in FIG. 5A;

FIG. 5C is a plan view of a pattern formed on a wafer using a phase shift reticle constructed as shown in FIGS. 5A and 5B;

DETAILED DESCRIPTION OF THE PREFERRED EMBODIMENT

As used herein, the term "reticle" refers to a "mask" that can be used to form a pattern of features on a target using a lithographic process (e.g., photolithography, e-beam lithography, x-ray lithography). The reticle can be used directly to form a pattern of features on the target. Alternately "working masks" can be made from the reticle, by printing or other techniques, and these working masks can be used during the actual lithographic process.

Figure 1:
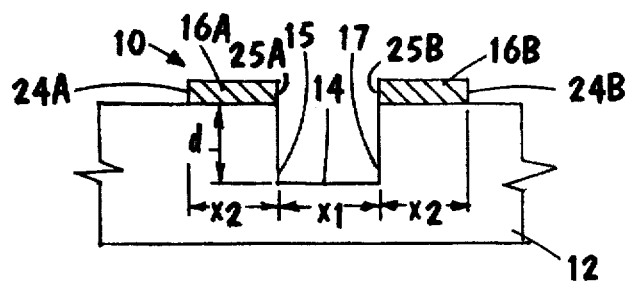
FIG. 1 is a schematic cross sectional view of a phase shift structure constructed in accordance with the invention.

Referring now to FIG. 1, a phase shift structure 10 constructed in accordance with the invention is shown. The phase shift structure 10 includes: a transparent substrate 12; a phase shifter 14 etched into the substrate 12; and a pair of opaque members 16A, 16B formed on the substrate 12 on either side of the phase shifter 14.

The substrate 12 is formed of a material that is transparent to light at an exposure wavelength (e.g., 365 nm). Quartz (fused silica) is one material that can be used to form the substrate 12. Alternately, other transparent materials having suitable optical, mechanical and chemical properties can be used. As an example, for 193 nm lithography, $Al_2O_3$ could be used in place of quartz.

The phase shifter 14 is etched into the substrate 12 to a depth of d. This depth and the index of refraction ($n_1$) of the substrate 12 are selected to provide a phase shift of 180° ($\pi$) or odd integral multiple thereof for exposure light passing through the phase shifter 14 with respect exposure light passing through unetched portions of the substrate 12. The depth d can be determined by mathematical relationships using the well known formula:

$$d = i\lambda/2(n-1)$$

where d=depth i=an odd integer

λ=wavelength of exposure light n=refractive index of phase shift material at the exposure wavelength.

Figure 3A:
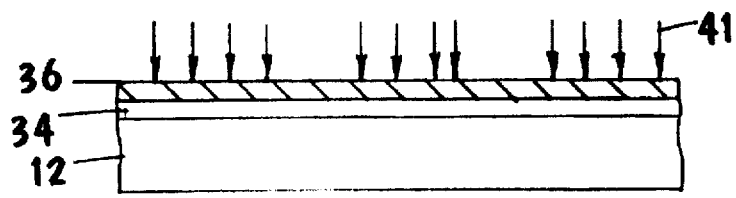
FIGS. 3A–3D are schematic cross sectional views illustrating the steps involved in forming a phase shift structure as shown in FIG. 1 in accordance with the invention using an anisotropic etch process.
Figure 3B:
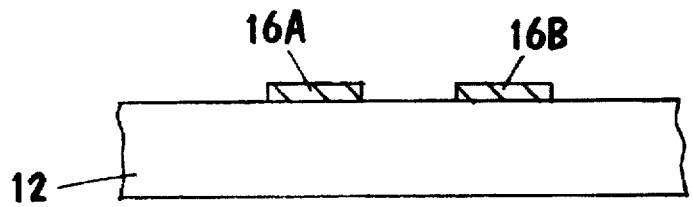
Figure 3C:
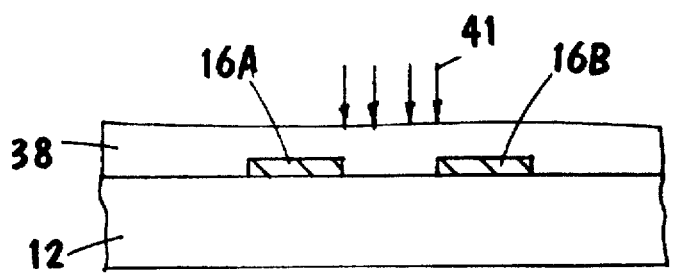
Figure 3D:
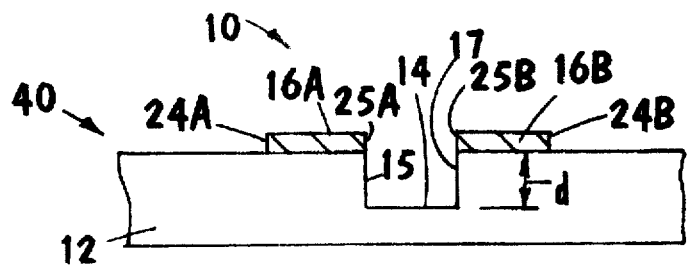
Figure 4C:
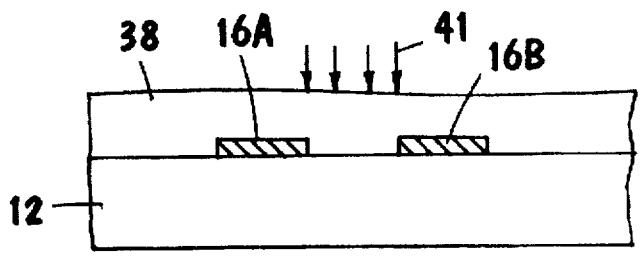
FIGS. 4C–4E are schematic cross sectional views illustrating the steps involved in forming a phase shift structure in accordance with the invention using a combination anisotropic and isotropic etch process.
Figure 4D:
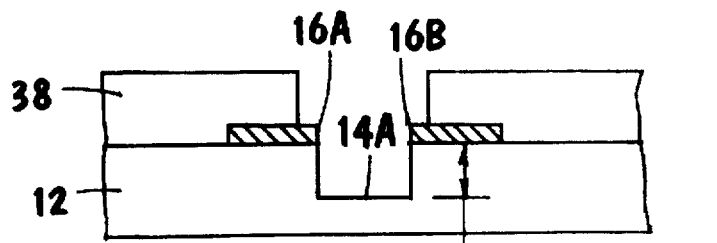
Figure 4E:
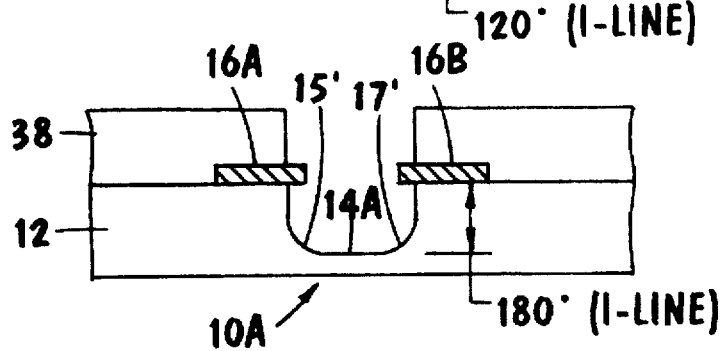

As will be further explained, the phase shifter 14 can be etched into the substrate 12 using an anisotropic etch process and a suitable dry etchant (FIGS. 3A–3D) or using a combination anisotropic and isotropic etch process (FIGS. 4C–4E and FIGS. 4CC–4EE).

Viewed from above (i.e., aerial view), the length of phase shifter 14 can be made to correspond to a desired length for the printed feature. In addition, the phase shifter 14 is formed with a width of $x_1$. As will be further explained, values for the width $x_1$ along with values for the widths $x_2$ of the opaque members, are selected to form a feature with a desired width. In general, the width $x_1$ must be small enough such that the phase shifter 14 does not print a corresponding line on the wafer. By way of example and not limitation, at an exposure wavelength of 365 nm (i.e., I line), the width $x_1$ can be between about 0.25 μm to 1.0 μm for a 5× optical projection lithographic system. In a 1× system, also at an exposure wavelength of 365 nm, $x_1$ can be between about 0.1 μm to 0.25 μm.

At smaller values for the width $x_1$, process latitude will be reduced because the influence of the phase shifter 14 will be minimal. Therefore at smaller values for the width $x_1$, other process parameters such as exposure and focus must be closely controlled. At larger values for the width $x_1$, the etched phase shifter 14 will begin to print a line on the wafer and this is undesirable.

The opaque members 16A, 16B are formed on either side of the phase shifter 14. As will be further explained, the outside edges 24A, 24B of the opaque members 16A, 16B will correspond to the longitudinal edges 32A, 32B (FIG. 2) of the printed feature 30 (FIG. 2D). The inside edges 25A, 25B of the opaque members 16A, 16B are formed adjacent to the sides 15, 17 of the phase shifter 14 and do not print on the target. The opaque members 16A, 16B are preferably formed of a material that is highly opaque at wavelengths used in lithography. Exemplary materials include: chromium; chrome; mixtures of chromium, oxygen and nitrogen; and mixtures of molybdenum, silicon, oxygen and nitrogen. As will be further explained, the opaque members 16A, 16B can be blanket conformally deposited using a deposition process such as CVD or sputtering, patterned using a mask and then etched.

The opaque members 16A, 16B are formed with a width of $x_2$. By way of example and not limitation, at an exposure wavelength of 365 nm, the value of the dimension $x_2$ will be between about 0.25 μm to 1.75 μm for a 5× optical projection lithographic system. In a 1× system, also at an exposure wavelength of 365 nm (i.e., I-line), $x_2$ will be between about 0.1 μm to 0.25 μm.

Referring now to FIGS. 2A–2D, operational characteristics of the phase shift structure 10 in use in a coherent imaging system are shown. With a perfectly coherent source, the light emitted from the source is in phase at all points along the emitted wave fronts. In use in a photolithographic process, the phase shift structure 10 is placed between the source (not shown) and a semiconductor wafer 18 (FIG. 2D) coated with a layer of resist. An objective lens (not shown) can be located between the phase shift structure 10 and the wafer 18. The objective lens can reduce the size of the projected pattern at the wafer 18 (e.g., 5×, 4×or 10×).

By way of example and not limitation, other representative process conditions include λ=365 nm where λ is the exposure illumination wavelength, NA=0.6 where NA is the numerical aperture of the objective lens, sigma=0.3 where sigma is the depth of focus, the dimension $x_1$ (FIG. 1) for the phase shifter 14 is between about 0.25 μm and 1.0 μm for a 5× reticle (i.e., 0.25 μm<$x_1$<1.0 μm @5×) and the dimensions $x_2$ (FIG. 1) for the opaque members 16A, 16B is between about 0.25 μm to 1.75 μm for a 5× reticle (i.e., 0.25 μm<$x_2$<1.75 μm @5×).

Figure 2A:
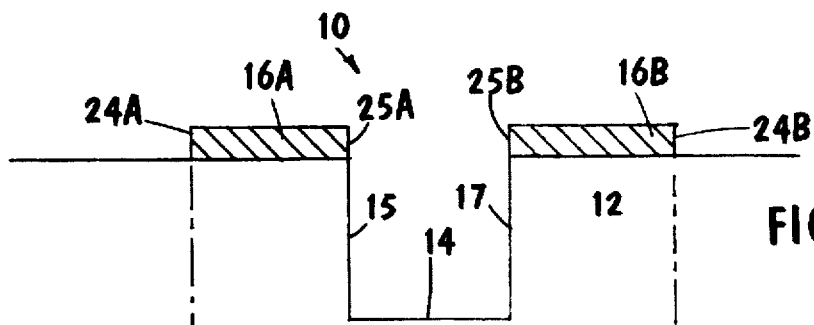
FIGS. 2A–2D are schematic views illustrating the operational characteristics of the phase shift structure shown in FIG. 1.
Figure 2B:
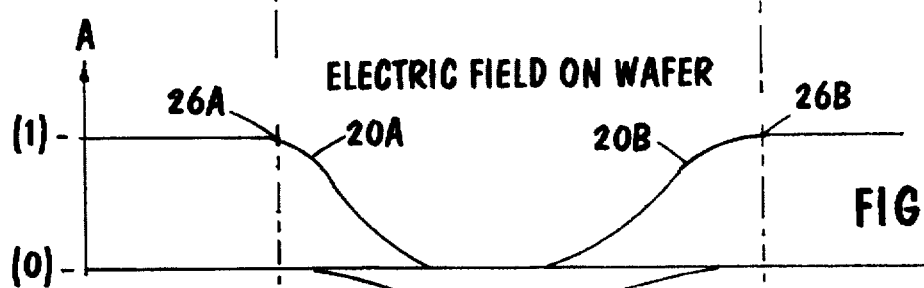
Figure 2C:
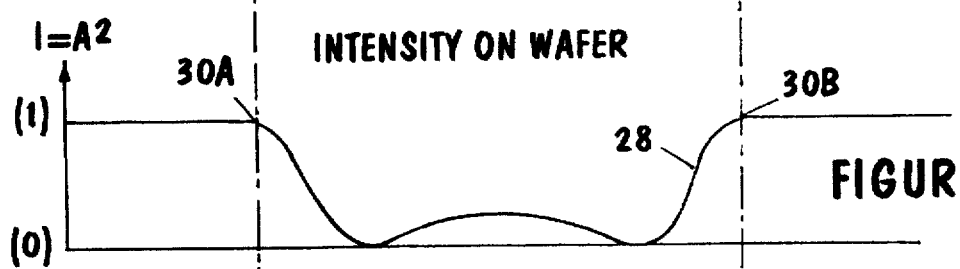
Figure 2D:
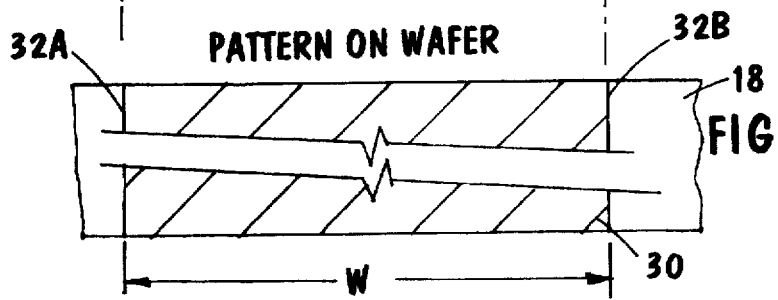

The amplitude (A) of the electric field produced by the phase shift structure 10 on the wafer 18 is shown in FIG. 2B. The square of the electric field or intensity I ($I=A^2$) produced by the phase shift structure 10 on the wafer 18 is shown in FIG. 2C. The pattern printed by the phase shift structure 10 on a layer of photoresist formed on the wafer 18 is shown in FIG. 2D.

In FIG. 2B, the amplitude of the electric field produced by opaque member 16A (FIG. 2A) is represented by curve 20A. The amplitude decreases from 1 at a point 26A, corresponding to longitudinal edge 24A (FIG. 2A) of the opaque member 16A, to zero. In a similar manner, the amplitude of the electric field produced by opaque member 16B (FIG. 2A) is represented by curve 20B. The amplitude decreases from 1 at a point 26B, corresponding to longitudinal edge 24B (FIG. 2A) of the opaque member 16B, to zero. The amplitude of the electric field produced by the phase shifter 14 is represented by curve 22.

In FIG. 2C, the intensity (I) on the wafer 18 is represented by intensity curve 28. Points 30A and 30B correspond to the longitudinal edges 24A and 24B of the opaque members 16A and 16B (FIG. 2A) respectively. As is apparent, the drop in intensity from points 30A and 30B is relatively steep due to the interaction of the phase shifter 14 with light diffracted from the edges 24A, 24B of the opaque members 16A, 16B. Accordingly, a corresponding image printed on the wafer will include sharp edges. As is also apparent, the intensity on the wafer between points 30A and 30B is close to zero due to phase canceling produced by the phase shifter 22.

In FIG. 2D, a printed feature 30 on the wafer 18, viewed from above, is represented by the diagonally hatched area. The printed feature 30 is a linear, or elongated, feature that has a length much larger than width. A longitudinal edge 32A of the printed feature 30 corresponds to the longitudinal edge 24A (FIG. 2A) of the phase shift structure 10. A longitudinal edge 32B of the printed feature corresponds to the longitudinal edge 24B (FIG. 2A) of the phase shift structure 10. The longitudinal edges 32A and 32B of the printed feature will be relatively sharp (i.e., high resolution) due to the sharp drop in the intensity curve 28 from points 30A and 30B.

A width "w" of the printed feature 30 will be approximately equal to the total width of the phase shift structure 10 (i.e., $x_2+x_1+x_2$). However, because a portion of the exposure light is canceled out by the phase shifter 14, the width "w" of the printed feature will be slightly larger than the sum ($x_2+x_1+x_2$).

Referring now to FIGS. 3A–3C, a method for forming a reticle containing the phase shift structure 10 is shown. Initially, a transparent substrate 12 (e.g., quartz) is formed. As shown in FIG. 3A, an opaque layer 34 is formed on the substrate. The opaque layer 34 can be formed of an opaque material as previously described. The opaque layer 34 can be blanket conformally deposited using a deposition process such as CVD or sputtering.

As also shown in FIG. 3A, following deposition of the opaque layer 34, a layer of resist 36 is formed on the opaque layer 34 such as by spin deposition. In the illustrative embodiment, this is a positive tone resist. The layer of resist 36 is then exposed using exposure radiation 41 directed through a mask pattern (not shown). A preferred method of exposing the resist 36 in a desired pattern is with an electron beam mask writer. An exemplary electron beam resist is polybutene (PBS) supplied by DuPont photoblanks division of Poughkeepsie, N.Y. A suitable E-beam mask writer for patterning the resist 36 is manufactured by Cambridge and is designated an EBMF 10.5 e-beam system. Another suitable e-beam system is a MEBES™ 4500 mask writer sold by ETEC Systems, Inc., 26460 Corporate Ave., Hayward, Calif. 94545.

Following exposure, the layer of resist 36 is developed using a suitable developer. As shown in FIG. 3B, the developed layer of photoresist 36 is used to etch the opaque layer 34 to form a pattern of opaque members 16A, 16B. Depending on the materials selected, the opaque layer 34 can be etched using a suitable wet etchant.

Next, as shown in FIG. 3C, a layer of resist 38 is deposited over the opaque members 16A and 16B and over the substrate 12. The layer of resist 38 is then exposed using an exposure radiation 41, and developed to form a resist mask. As before, e-beam lithography can be used to expose the resist 38.

Next, as shown in FIG. 3D, the resist mask is used to etch the substrate 12 to form a phase shifter 14 between the opaque members 16A, 16B. In FIG. 3D, a dry anisotropic etch process is used to form the phase shifters 14 with a vertical profile.

For a dry etch process (FIG. 3D) and a substrate 12 formed of quartz, the etchant can comprise a dry fluorinated gas mixture of $CHF_3$, $CF_4$, and $O_2$. The resist mask for the dry etch process is formed such that the sides 15, 17 of the phase shifter 14 are vertical and align with the inside edges 25A, 25B of the opaque members 16A, 16B. In addition, the etch process is controlled to etch the phase shifters 14 with a depth of "d" to achieve a phase shift of 180°. The endpoint of the etch can be measured or estimated from the etching condition. The completed reticle in FIG. 3D is designated 40.

Referring now to FIG. 4C–4E a method for forming the phase shift structure 10A (FIG. 4E) using a combination anisotropic and isotropic etch process is shown. In FIG. 4C the process sequence is the same as previously explained with reference to FIGS. 3A–3C. The opaque members 16A and 16B have been formed substantially as previously described and a layer of resist 38 has been formed over the opaque members 16A and 16B.

In FIG. 4D the layer of resist 38 has been exposed and developed. At this point the substrate 12 is anisotropically etched using a suitable dry etchant as previously explained. However, in this case the depth of the etch into the substrate 12 is controlled to achieve a partial phase shift of 120° for I-line photolithography.

Next, as shown in FIG. 4E, an isotropic etch is performed to complete the phase shifter 14A to provide a 180° phase shift. For a wet isotropic etch process and a substrate 12 formed of quartz, the etchant can comprise diluted hydrofluoric acid (HF) in water. In this case, the sides 15' and 17' of the phase shifter 14A will have a rounded profile. In addition, the phase shifter 14A will undercut the substrate 12 subjacent to the opaque members 16A, 16B and produce an overhang. One advantage of the undercut rounded profile is that diffraction effects can be minimized. In other words, the amount of exposure light lost by diffraction will be reduced.

Figure 4F:
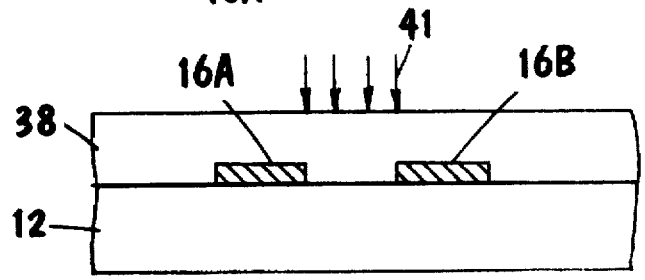
FIGS. 4F–4H are schematic cross sectional views illustrating the steps involved in forming a phase shift structure in accordance with the invention using another combination anisotropic and isotropic etch process.
Figure 4G:
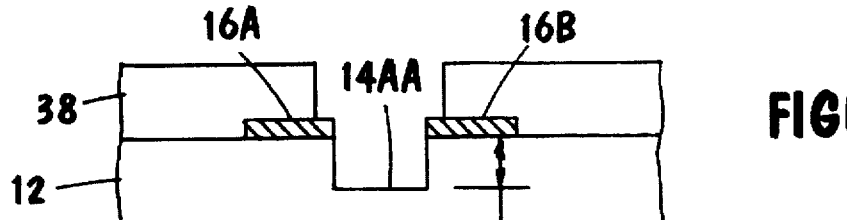
Figure 4H:
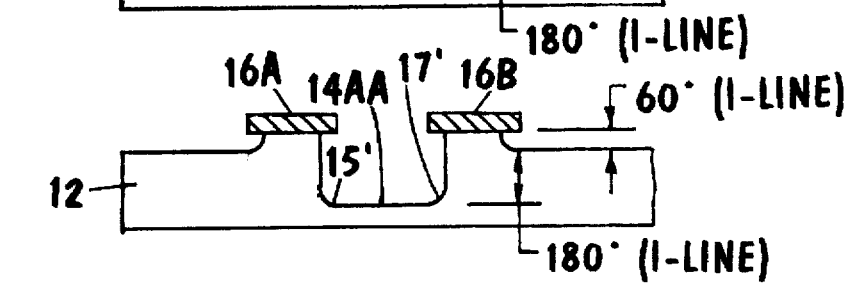

FIGS. 4F–4H illustrate another combination anisotropic and isotropic etch process for forming the phase shifter 14AA. In this process and as shown in FIG. 4G, the substrate 12 is anisotropically etched to achieve a phase shift of 180° for I-line photolithography. Next, as shown in FIG. 4H, the entire substrate 12 including the phase shifter 14AA is isotropically etched to achieve an additional 60° phase shift for the phase shifter 14AA. As before, for a substrate formed of quartz, the wet etchant can comprise diluted hydrofluoric acid (HF) in water. Again, the sides 15' and 17' of the phase shifter 14AA will have a rounded profile. In addition, the substrate 12 subjacent to the opaque members 16A, 16B on either side of the opaque members 16A, 16B will be undercut.

Referring now to FIGS. 5A and 5B, a test reticle 40A was formed with a phase shift structure 10 constructed as previously described. The phase shift structure 10 was formed with a dimension of $x_1=x_2=0.5$ μm. For a 5× reduction lithographic system, this corresponded to a printed dimension at the wafer of 0.1 μm.

The test reticle 40A also included a test opaque member 42 formed with a width $z_1$ of 1.5 μm (i.e., 0.3 μm @5×) and a test opaque member 44 formed with a width $z_2$ of 1.75 μm (i.e., 0.35 μm @5×). The aerial image of the printed features is shown in FIG. 5C. The printed feature 30 corresponds to the image projected by the phase shift structure 10. The printed feature 42A corresponds to the image projected by test opaque member 42. The printed feature 44A corresponds to the image projected by the test opaque member 44.

In general, the edges 32A and 32B of the printed feature 30 formed by the phase shift structure 10 were sharper than the corresponding edges 46 formed by the test opaque members 42 and 44. The hump 48 in the printed feature 30 corresponds to light leakage through the feature. This light leakage can be minimized by adjusting the width $x_1$ (FIG. 1) of the phase shifter 14. In general, for decreasing the light leakage the width x1 can be decreased. An optimal value for the width $x_1$ for obtaining a minimum amount of light leakage @5× and an exposure wavelength of 365 nm is 0.25 to 1 μm.

In general, the phase shift structure 10 can be used in semiconductor manufacture to form an isolated linear feature such as isolated opaque lines on integrated circuit devices. One advantage of the phase shift structure 10 is that less space is required than with assist-slots and outrigger types of phase shift structure. In addition, the phase shift structure 10 can be fabricated more easily than a rim phase-shifting structure. Furthermore, unlike chromeless phase shift reticles, the phase shift structure can be adjusted to minimize light leakage.

Figure 6A:
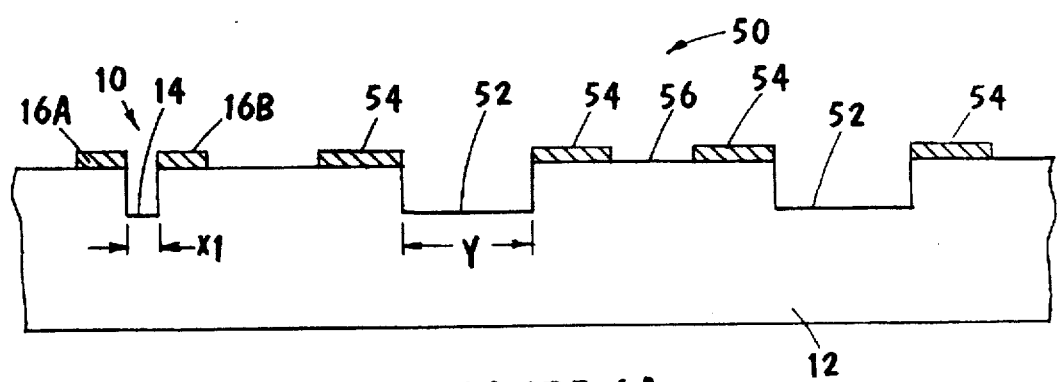
FIG. 6A is a schematic cross sectional view of a phase shift structure constructed in accordance with the invention on a reticle having an alternating aperture phase shift pattern.

Another advantage of the phase shift structure 10 is that it can be combined on a reticle with an alternating aperture pattern of phase shifters. As shown in FIG. 6A, a phase shift reticle includes an alternating aperture phase shifting pattern 50. The alternating aperture phase shifting pattern 50 includes phase shifters 52 alternating with a pattern of light transmission openings 56. Opaque light blockers 54 are formed on either side of the phase shifters 52. In the alternating aperture phase shift pattern 50, the printed pattern is defined by the opaque light blockers 54. The phase shifters 52 interact with the light transmission openings 56 to overcome the effect of light diffracted from the edges of the opaque light blockers 54.

Figure 6B:
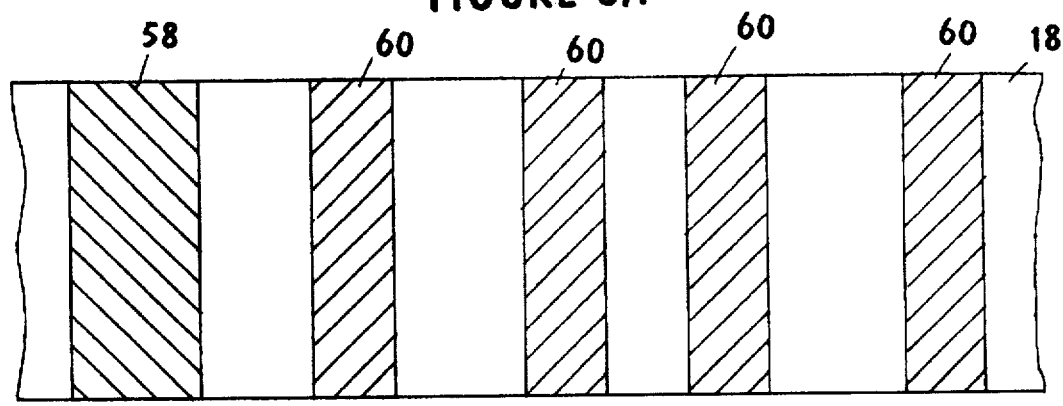
FIG. 6B is a plan view of a pattern formed on a wafer using a phase shift reticle constructed as shown in FIG. 6A.

The phase shift structure 10 constructed in accordance with the invention is formed on the reticle spaced from the alternating aperture pattern 50 to print an isolated feature as previously explained. In FIG. 6B, the pattern printed on the wafer 18 includes an isolated linear feature 58 formed by the phase shift structure 10. In addition, features 60 are formed by the alternating aperture phase shift pattern 50. As previously stated, the width $x_1$ of the phase shifter 14 @5× and an exposure wavelength of 365 nm is preferably about 0.25 to 1.0 μm (e.g., 0.25 μm<$x_1$<1.0 μm). This compares to the width "y" of phase shifter 52 which under the same conditions is much larger. Specifically, the width "y" will be between about 1.5 μm and 2.5 μm (e.g., 1.5 μm<y<2.5 μm).

Thus, the invention provides an improved phase shift structure and a method for forming the phase shift structure. Although the method of the invention has been described with reference to certain preferred embodiments and preferred methods, as will be apparent to those skilled in the art, certain changes and modifications can be made without departing from the scope of the invention as defined by the following claim.

I claim:

1. A method for forming a phase shift reticle comprising:

providing a transparent substrate;

forming an opaque layer on the substrate;

etching the opaque layer to form a pair of spaced opaque members, each opaque member having a first edge and a second edge, each opaque member having a width of from about 0.25 μm to 1.75 μm; and etching the substrate to form a phase shifter between the first edges of the opaque members, said phase shifter having a width of from about 0.25 μm to 1.0 μm, said opaque members and phase shifter configured to print a feature on a target, said feature having edges defined by the second edges of the opaque members.

2. The method as claimed in claim 1 wherein etching the substrate comprises an anisotropic etch process.

3. The method as claimed in claim 1 wherein etching the substrate comprises anisotropically etching the substrate to a first depth and then isotropically etching the substrate to a second depth.

4. The method as claimed in claim 1 wherein etching the substrate comprises anisotropically etching the phase shifter to a first depth and then isotropically etching all of the substrate including the phase shifter to a second depth.

5. A method for forming a phase shift reticle comprising:

providing a transparent substrate;

forming a first opaque member on the substrate, said first opaque member having a first edge and a second edge, said first opaque member having a first width between about 0.25 μm to 1.75 μm;

forming a second opaque member on the substrate, said second opaque member having a third edge and a fourth edge, said second opaque member having a second width between about 0.25 μm to 1.75 μm;

forming a phase shifter between the first edge and the third edge, said phase shifter having a third width of about 0.25 μm to 1.0 μm.

6. The method as claimed in claim 5 wherein forming the phase shifter comprises etching the substrate to a depth to provide a phase shift of π or odd integral multiple thereof.

7. The method as claimed in claim 5 wherein a fourth width of the feature corresponds to the first, second and third widths.

8. The method as claimed in claim 5 further comprising forming an alternating aperture phase shift pattern on the substrate proximate to the first or second opaque member.

9. The method as claimed in claim 5 wherein forming the phase shifter comprises anisotropically etching the substrate.

10. A method for fabricating a phase shift reticle comprising:

providing a transparent substrate;

forming a phase shifter on the substrate, said phase shifter having a first edge, a second edge and a width x1;

forming a first opaque member on the substrate proximate to the first edge, said first opaque member having a third edge and a width of x2;

forming a second opaque member on the substrate proximate to the second edge, said second opaque member having a fourth edge and a width of x3;

selecting a dimensional value for x1, x2 and x3 such that during a lithographic process using the reticle, a feature printed on a target has an overall width corresponding to x1+x2+x3, a fifth edge corresponding to the second edge, and a sixth edge corresponding to the third edge.

11. The method as claimed in claim 10 wherein x1 equals 0.1 μm to 0.25 μm.

12. The method as claimed in claim 10 wherein x1 equals 0.25 μm to 1.0 μm.

13. A method for forming a phase shift structure for forming an isolated linear feature on a semiconductor wafer, during a lithographic process, said method comprising:

forming a transparent substrate;

forming a first opaque member on the substrate having an outer edge and an inner edge;

forming a second opaque member on the substrate having an outer edge and an inner edge;

etching a phase shifter between the inner edges of the first and second opaque members;

controlling the etching step to form the phase shifter with a depth to provide a phase shift for light passing through the phase shifter relative to light passing through a remainder of the substrate; and controlling the etching step to form the phase shifter with a width to form the linear feature with longitudinal edges corresponding to the outer edges of the opaque members.

14. A method for forming a phase shift structure for forming an isolated linear feature on a target, during a lithographic process with a 5× optical projection system at an exposure wavelength of 365 nm, said method comprising:

forming a transparent substrate;

forming a first opaque member on the substrate having an outer edge and an inner edge;

forming a second opaque member on the substrate having an outer edge and an inner edge;

etching a phase shifter between the inner edges of the first and second opaque members;

controlling the etching step to form the phase shifter with a depth to provide a phase shift for light passing through the phase shifter relative to light passing through a remainder of the substrate; and controlling the etching step to form the phase shifter with a width between about 0.25 μm to 1.0 μm to form the linear feature with longitudinal edges corresponding to the outer edges of the opaque members.

15. A method for forming a phase shift structure for forming an isolated linear feature on a target, during a lithographic process with a 5× optical projection system at an exposure wavelength of 365 nm, said method comprising:

forming a transparent substrate;

forming a first opaque member on the substrate having an outer edge and an inner edge, and a first width between about 0.25 μm to 1.75 μm;

forming a second opaque member on the substrate having an outer edge and an inner edge, and a second width between about 0.25 μm to 1.75 μm;

etching a phase shifter between the inner edges of the first and second opaque members;

controlling the etching step to form the phase shifter with a depth to provide a phase shift for light passing through the phase shifter relative to light passing through a remainder of the substrate; and controlling the etching step to form the phase shifter with a third width to form the linear feature with longitudinal edges corresponding to the outer edges of the opaque members.

16. A method for forming a phase shift structure for forming an isolated linear feature on a target, during a lithographic process with a 1× optical projection system at an exposure wavelength of 365 nm, said method comprising:

forming a transparent substrate;

forming a first opaque member on the substrate having an outer edge and an inner edge;

forming a second opaque member on the substrate having an outer edge and an inner edge;

etching a phase shifter between the inner edges of the first and second opaque members;

controlling the etching step to form the phase shifter with a depth to provide a phase shift for light passing through the phase shifter relative to light passing through a remainder of the substrate; and controlling the etching step to form the phase shifter with a width between about 0.1 μm to 0.25 μm to form the linear feature with longitudinal edges corresponding to the outer edges of the opaque members.

17. A method for forming a phase shift structure for forming an isolated linear feature on a target, during a lithographic process with a 1× optical projection system at an exposure wavelength of 365 nm, said method comprising:

forming a transparent substrate;

forming a first opaque member on the substrate having an outer edge and an inner edge, and a first width between about 0.1 μm to 0.25 μm;

forming a second opaque member on the substrate having an outer edge and an inner edge, and a second width between about 0.1 μm to 0.25 μm;

etching a phase shifter between the inner edges of the first and second opaque members;

controlling the etching step to form the phase shifter with a depth to provide a phase shift for light passing through the phase shifter relative to light passing through a remainder of the substrate; and controlling the etching step to form the phase shifter with a third width to form the linear feature with longitudinal edges corresponding to the outer edges of the opaque members.

18. A method of phase shift lithography comprising:

providing a target with a layer of resist;

providing a 5× reticle comprising a transparent substrate and a phase shift structure, said phase shift structure comprising a pair of spaced opaque members, each opaque member having a first edge and a second edge, each opaque member having a width of from about 0.25 µm to 1.75 µm, said phase shift structure further comprising a phase shifter between the first edges of the opaque members, said phase shifter having a width of from about 0.25 µm to 1.0 µm;

passing an exposure energy through the reticle to print a feature on the target, said feature having edges defined by the second edges of the opaque members.

19. The method as claimed in claim 18 wherein the phase shifter comprises an indentation etched into the substrate.

20. The method as claimed in claim 18 wherein the opaque members comprise a layer deposited on the substrate.

21. The method as claimed in claim 18 wherein the exposure energy has a wavelength of about 365 nm.

22. A method of phase shift lithography comprising:

providing a target with a layer of resist;

providing a 1× reticle comprising a transparent substrate and a phase shift structure, said phase shift structure comprising a pair of spaced opaque members, each opaque member having a first edge and a second edge, each opaque member having a width of from about 0.1 µm to 0.25 µm, said phase shift structure further comprising a phase shifter between the first edges of the opaque members, said phase shifter having a width of from about 0.1 µm to 0.25 µm;

passing an exposure energy through the reticle to print a feature on the target, said feature having edges defined by the second edges of the opaque members.

23. The method as claimed in claim 22 wherein the phase shifter comprises an indentation etched into the substrate.

24. The method as claimed in claim 22 wherein the opaque members comprise a layer deposited on the substrate.

25. The method as claimed in claim 22 wherein the exposure energy has a wavelength of about 365 nm.

26. A phase shift structure comprising:

a transparent substrate;

a phase shifter on the substrate, said phase shifter configured to provide a phase shift in exposure energy passing through the phase shifter, relative to exposure energy passing through a remainder of the substrate, said phase shifter having a width of about 0.1 µm to 0.25 µm;

a first opaque member on the substrate, said first opaque member including a first edge proximate to the phase shifter and a second edge;

a second opaque member on the substrate, said second opaque member including a third edge proximate to the phase shifter and a fourth edge;

said phase shifter, and said first and second opaque members, configured to print a feature on a target, said feature including edges defined by said second and fourth edges.

27. The phase shift structure as claimed in claim 26 wherein the feature comprises an isolated line on a semiconductor wafer.

28. The phase shift structure as claimed in claim 26 wherein a second width of the first and second opaque members is about 0.1 µm to 0.25 µm.

29. The phase shift structure as claimed in claim 26 wherein the exposure energy has a wavelength of about 365 nm.

30. The phase shift structure as claimed in claim 26 wherein a depth of the phase shifter is selected to provide a phase shift of π odd multiple thereof.

31. The phase shift structure as claimed in claim 26 wherein the phase shifter is anisotropically etched into the substrate with a vertical profile.

32. The phase shift structure as claimed in claim 26 wherein the phase shifter is etched into the substrate with an undercut profile using a combination anisotropic and isotropic etch process.

33. The phase shift structure as claimed in claim 26 wherein the substrate comprises a material selected from the group consisting of quartz and $Al_2O_3$.

34. The phase shift structure as claimed in claim 26 further comprising an alternating aperture phase shift pattern formed proximate to the first or second opaque member.

35. A phase shift structure comprising:

a transparent substrate;

a first opaque member on the substrate including a first edge and a second edge;

a second opaque member on the substrate including a third edge and a fourth edge;

a phase shifter on the substrate located between said first and third edges, said phase shifter configured to provide a phase shift for exposure energy passing through the phase shifter relative to exposure energy passing through a remainder of the substrate, said phase shifter having a width of from about 0.25 µm to 1.0 µm;

said phase shifter, and said first and second opaque members, configured to print a feature on a target, said feature including edges defined by said second and fourth edges.

36. The phase shift structure as claimed in claim 35 wherein the feature comprises an isolated line on a semiconductor wafer.

37. The phase shift structure as claimed in claim 35 wherein the phase shifter has a vertical profile.

38. The phase shift structure as claimed in claim 35 wherein the phase shifter has a profile that is rounded and undercuts the opaque members.

39. The phase shift structure as claimed in claim 35 further comprising an alternating aperture phase shift structure formed proximate to the phase shift structure.

40. The phase shift structure as claimed in claim 35 wherein the exposure energy has a wavelength of about 365 nm and the feature is reduced in size by 5×.

\* \* \* \* \*